US011515294B2

(12) United States Patent
Kwon et al.

(10) Patent No.: US 11,515,294 B2
(45) Date of Patent: Nov. 29, 2022

(54) LED TRANSFER METHOD AND DISPLAY MODULE MANUFACTURED THEREBY

(71) Applicant: SAMSUNG ELECTRONICS CO., LTD., Suwon-si (KR)

(72) Inventors: Ohjae Kwon, Suwon-si (KR); Jinmo Kang, Suwon-si (KR); Donghwan Kim, Suwon-si (KR); Yong Namkung, Suwon-si (KR); Seondeok Hwang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 199 days.

(21) Appl. No.: 16/891,242

(22) Filed: Jun. 3, 2020

(65) Prior Publication Data

US 2021/0013184 A1 Jan. 14, 2021

(30) Foreign Application Priority Data

Jul. 12, 2019 (KR) .................... 10-2019-0084598

(51) Int. Cl.
*H01L 21/00* (2006.01)
*H01L 25/075* (2006.01)
*H01L 25/16* (2006.01)

(52) U.S. Cl.
CPC ........ *H01L 25/0753* (2013.01); *H01L 25/167* (2013.01)

(58) Field of Classification Search
CPC ... H01L 25/0753; H01L 22/22; H01L 25/167; H01L 33/0095; H01L 2221/68354; H01L 33/0093; H01L 21/6835
See application file for complete search history.

(56) References Cited

U.S. PATENT DOCUMENTS

| 10,984,708 B1 * | 4/2021 | Pourchet ............... H05B 45/50 |
| 2008/0191879 A1 | 8/2008 | Kobayashi et al. |

(Continued)

FOREIGN PATENT DOCUMENTS

| EP | 3486946 A1 | 5/2019 |
| JP | 2646082 B2 | 8/1997 |

(Continued)

OTHER PUBLICATIONS

International Search Report (PCT/ISA/210) and Written Opinion (PCT/ISA/237) dated Sep. 18, 2020 issued by the International Searching Authority in International Application No. PCT/KR2020/007216.

(Continued)

*Primary Examiner* — Ismail A Muse
(74) *Attorney, Agent, or Firm* — Sughrue Mion, PLLC

(57) ABSTRACT

A micro light emitting diode (LED) transfer method includes: preparing a transfer substrate including a plurality of micro LEDs, the plurality of micro LEDs having electrodes disposed in a first direction and a second direction different from the first direction on the transfer substrate; sequentially transferring a first set of micro LEDs among the plurality of micro LEDs in block units from the transfer substrate to first regions of a target substrate; and sequentially transferring a second set of micro LEDs among the plurality of micro LEDs in block units from the transfer substrate to second regions of the target substrate, and in the sequential transferring of the second set of micro LEDs, the second set of micro LEDs transferred to the second regions are disposed in the same electrode direction as an electrode direction of the first set of micro LEDs transferred to the first regions.

8 Claims, 19 Drawing Sheets

(56) References Cited

U.S. PATENT DOCUMENTS

| | | |
|---|---|---|
| 2010/0259164 A1 | 10/2010 | Oohata et al. |
| 2016/0276323 A1 | 9/2016 | Okuyama |
| 2017/0062393 A1 | 3/2017 | Kim |
| 2018/0068995 A1* | 3/2018 | Kajiyama ............... H01L 25/13 |
| 2018/0166429 A1 | 6/2018 | Chong et al. |
| 2019/0157502 A1 | 5/2019 | Moon et al. |
| 2020/0243358 A1 | 7/2020 | Kwag et al. |

FOREIGN PATENT DOCUMENTS

| | | |
|---|---|---|
| JP | 2006041283 A | 2/2006 |
| JP | 2012-243920 A | 12/2012 |
| KR | 10-1900925 B1 | 9/2018 |
| KR | 1020190000479 A | 1/2019 |
| KR | 1020200094498 A | 8/2020 |
| WO | 2017/205132 A1 | 11/2017 |
| WO | 2020/159142 A1 | 8/2020 |

OTHER PUBLICATIONS

Extended European Search Report dated Mar. 15, 2022 issued by the European Patent Office for European Patent Application No. 20840874.0.

* cited by examiner

LED TRANSFER METHOD AND DISPLAY MODULE MANUFACTURED THEREBY

CROSS-REFERENCE TO RELATED APPLICATION(S)

This application is based on and claims priority under 35 U.S.C. § 119 to Korean Patent Application No. 10-2019-0084598, filed on Jul. 12, 2019, in the Korean Intellectual Property Office, the disclosure of which is herein incorporated by reference in its entirety.

BACKGROUND

Field

Apparatuses and methods consistent with the disclosure relate to a method for transferring a plurality of micro light emitting diodes (LEDs) from a transfer substrate to a target substrate and a display module manufactured thereby.

Description of the Related Art

A micro light emitting diode (LED) includes a subminiature inorganic light-emitting material that emits light by itself without a color filter and a backlight, and may refer to a subminiature LED of 100 µm or less.

A plurality of micro LEDs are grown in a chip form on a growth substrate through an epitaxial process and are manufactured. The micro LED manufactured as described above may be transferred onto a target substrate to constitute a display module.

A micro-luminescent diode (e.g., micro LED, mLED, or µLED) display panel is a flat display panel that includes a plurality of inorganic LEDs that are each smaller than 100 micrometers.

A micro LED display panel provides improved contrast, faster response time, and higher energy efficiency as compared to those of a liquid crystal panel that requires a back light.

Although both organic LEDs (OLEDs) and micro LEDs have high energy efficiency, micro LEDs are brighter, have improved luminous efficiency, and have a longer lifespan than OLEDs.

SUMMARY

Embodiments of the disclosure overcome the above disadvantages and other disadvantages not described above. Also, the disclosure is not required to overcome the disadvantages described above, and an embodiment of the disclosure may not overcome any of the problems described above.

According to an embodiment of the disclosure, a micro light emitting diode (LED) transfer method includes preparing a transfer substrate including a plurality of micro LEDs, the plurality of micro LEDs having electrodes and disposed in a plurality of blocks, where a number of micro LEDs are disposed in a block of the plurality of blocks, and each of the electrodes is disposed in a first direction or a second direction different from the first direction on the transfer substrate, sequentially transferring the plurality of micro LEDs in block units from the transfer substrate to a target substrate, where the sequentially transferring includes sequentially transferring a first set of micro LEDs among the micro LEDs disposed in the block from the transfer substrate to first regions of the target substrate, and sequentially transferring a second set of micro LEDs among the micro LEDs disposed in the block from the transfer substrate to second regions of the target substrate, where in the sequential transferring of the second set of micro LEDs, the second set of micro LEDs transferred to the second regions are disposed in the same electrode direction as an electrode direction of the first set of micro LEDs transferred to the first regions.

In the sequential transferring of the first set of micro LEDs and the sequential transferring of the second set of micro LEDs, the first set of micro LEDs and the second set of micro LEDs are transferred in block units from the same regions set in the transfer substrate to the first and second regions of the target substrate, respectively.

In the sequential transferring of the second set of micro LEDs, micro LEDs having electrodes disposed in the second direction on the transfer substrate are transferred to the second regions after a posture of the second set of micro LEDs is changed so that the electrodes of the second set of micro LEDs are disposed in the first direction.

The first direction and the second direction are different by a rotation angle of 180° on a parallel plane.

The posture of the second set of micro LEDs having the electrodes disposed in the second direction on the transfer substrate is switched as the second set of micro LEDs are rotated by 180° by a picker.

The posture of the second set of micro LEDs having the electrodes disposed in the second direction on the transfer substrate is switched as the transfer substrate is rotated by 180°.

The second set of micro LEDs having the electrodes disposed in the second direction on the transfer substrate are transferred to the second regions in a state in which the target substrate is rotated by 180°.

The first and second regions are alternately set along a row direction or a column direction of the target substrate.

According to another embodiment of the disclosure, a micro light emitting diode (LED) transfer method includes preparing a first transfer substrate including a plurality of first micro LEDs of which electrodes are disposed in a first direction, and a second transfer substrate including a plurality of second micro LEDs of which electrodes are disposed in a second direction different from the first direction, sequentially transferring the plurality of first micro LEDs in block units from the first transfer substrate to first regions of a target substrate, and sequentially transferring the plurality of second micro LEDs in block units from the second transfer substrate to second regions of the target substrate, where in the sequential transferring of the plurality of second micro LEDs, the plurality of second micro LEDs transferred to the second regions are disposed in the same electrode direction as an electrode direction of the plurality of first micro LEDs transferred to the first regions.

In the sequential transferring of the plurality of first micro LEDs, a first set of micro LEDs disposed on one region of a plurality of regions of the first transfer substrate are transferred in block units to the first regions of the target substrate, and in the sequential transferring of the plurality of second micro LEDs, a second set of micro LEDs disposed on one region of the second transfer substrate corresponding to one region of the rust transfer substrate are transferred in block units to the second regions of the target substrate.

In the sequential transferring of the plurality of second micro LEDs, the second set of micro LEDs have electrodes disposed in the second direction on the second transfer substrate and are transferred to the second regions after a posture of the second set of micro LEDs is changed so that the electrodes are disposed in the first direction.

The posture of the second set of micro LEDs having the electrodes disposed in the second direction on the second transfer substrate is switched as the second set of micro LEDs are rotated by 180° by a picker.

The posture of the micro LEDs having the electrodes disposed in the second direction on the second transfer substrate is switched as the second transfer substrate is rotated by 180°.

The second set of micro LEDs having the electrodes disposed in the second direction on the second transfer substrate are transferred to the second regions in a state in which the target substrate is rotated by 180°.

The first and second regions are alternately set along a row direction or a column direction of the target substrate.

According to still another embodiment of the disclosure, a non-transitory computer readable recording medium including a program for executing a micro light emitting diode (LED) transfer method is provided, where the micro LED transfer method includes preparing a transfer substrate including a plurality of micro LEDs, the plurality of micro LEDs having electrodes and disposed in a plurality of blocks, where a number of micro LEDs are disposed in a block of the plurality of blocks, and each of the electrodes is disposed in a first direction or a second direction different from the first direction on the transfer substrate, sequentially transferring the plurality of micro LEDs in block units from the transfer substrate to a target substrate, where the sequentially transferring includes sequentially transferring a first set of micro LEDs among the micro LEDs disposed in the block from the transfer substrate to first regions of the target substrate, and sequentially transferring a second set of micro LEDs among the micro LEDs disposed in the block from the transfer substrate to second regions of the target substrate, where in the sequential transferring of the second set of micro LEDs, the second set of micro LEDs transferred to the second regions are disposed in the same electrode direction as an electrode direction of the first set of micro LEDs transferred to the first regions.

BRIEF DESCRIPTION OF THE DRAWINGS

The above and/or other aspects of the disclosure will be more apparent by describing certain embodiments of the disclosure with reference to the accompanying drawings, in which.

DETAILED DESCRIPTION

Figure 1:
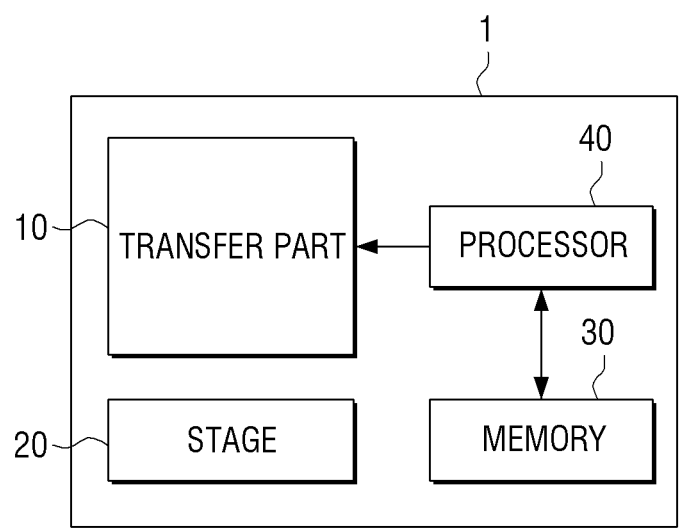
FIG. 1 is a schematic block diagram illustrating an apparatus for transferring micro LEDs according to an embodiment of the disclosure.

In order to fully understand the configuration and effects of the disclosure, embodiments of the disclosure will be described with reference to the accompanying drawings. However, the disclosure is not limited to embodiments disclosed below, but may be implemented in various forms and may be variously modified. The description of the embodiments is provided only to make the disclosure complete, and to fully inform the scope of the disclosure to those skilled in the art. In the accompanying drawings, for convenience of description, the size of the components is illustrated to be larger than the actual size, and the ratio of each component may be exaggerated or reduced.

Unless otherwise defined, terms used in the embodiments of the disclosure may be interpreted as meanings commonly known to those skilled in the art.

A display module manufactured according to embodiments of the disclosure may include a substrate, a thin film transistor (TFT) layer formed on one surface of the substrate, a plurality of micro LEDs arranged to be electrically connected to the TFT layer, and a wiring electrically connecting circuits disposed on a rear surface of the substrate. Here, the substrate may be a transparent substrate (a glass substrate, a quartz substrate, or the like) and may be referred to as a backplane. In addition, a substrate including the TFT layer may be referred to as a 'TFT substrate', a 'TFT back plane' or a 'target substrate', and such terms may be interchangeably used in the disclosure.

In the disclosure, the display module may include a separate substrate (the separate substrate may be disposed at the rear of the target substrate and is referred to hereinafter as a rear substrate in consideration of such arrangement) that is electrically connected to a rear surface of the target substrate through a flexible printed circuit (FPC). Here, the rear substrate may be formed in a form of thin film or a form of thin glass having a thickness of several tens of μm (e.g., 50 μm or less). In the case in which the rear substrate is formed of the form of thin film, the rear substrate may be formed of a plastic material, for example, any one of polyimide (PI), polyethylene terephthalate (PET), polyethersulfone (PES), polyethylene napthalate (PEN), and polycarbonate (PC).

A display module according to an example embodiment may be applied in single unit to a wearable devices, portable devices, handheld devices, various electronic device which requires display and be applied in matrix type to a PC (personal computer) monitors, high-resolution TVs and signage, electronic display, etc. through multiple assembly arrangements.

The target substrate according to an embodiment of the disclosure may have a side wiring formed on an edge portion of the target substrate, and the side wiring may electrically connect a first connection pad formed on an edge portion of a front surface of the target substrate and a second connection pad formed on the rear surface of the target substrate. To this end, the side wiring may be formed along the front surface, a side end surface, and the rear surface of the target substrate, and may have one end electrically connected to the first connection pad and the other end electrically connected to the second connection pad. At this time, because the side wiring is partially formed on the side end surface of the target substrate, the side wiring may protrude more than the side end surface of the target substrate by a thickness of the side wiring. In this case, the rear substrate may be electrically connected to the second connection pad through the FPC. A driver integrated circuit (IC) mounted on the rear surface of the target substrate may be directly connected to the second connection pad or indirectly connected to the second connection pad through a separate wiring. A plurality of display modules configured as described above may be arranged in a tiled type to manufacture a large display device.

The micro LED according to the disclosure has a size of 100 μm or less and preferably 30 μm or less. Such a micro LED may be formed of an inorganic light emitting material, and may be a semiconductor chip capable of emitting light by itself when power is supplied. In addition, the micro LED may be formed in a flip chip type or a vertical type having an anode electrode and a cathode electrode formed on one surface thereof and emitting light on the opposite side of one surface on which the electrodes are formed.

The micro LED according to the disclosure has fast response speed, low power, and high luminance, and thus has been in the spotlight as a light emitting device of next generation display. Specifically, the micro LED has a higher efficiency of converting electricity to photons than a conventional liquid crystal display (LCD) or organic light emitting diode (OLED). That is, the micro LED has a higher "brightness per watt" than a conventional LCD or OLED display. Accordingly, the micro LED may emit the same brightness with about half the energy as compared to the conventional LED (a width, a length, and a height exceed 100 μm, respectively) or OLED.

In addition, the micro LED may implement high resolution, excellent color, contrast, and brightness, thereby accurately expressing a wide range of colors, and implementing a clear screen even in the outdoor in which sunlight is bright. In addition, because the micro LED is resistant to a burn in phenomenon and has low heat generation, a long life is ensured without deformation.

A plurality of micro LEDs according to the disclosure may be transferred from a transfer substrate to a target substrate. The plurality of micro LEDs transported from a growth substrate to the transfer substrate may be transferred to the target substrate through a pick and place method. The pick and place method is a method of separating the plurality of micro LEDs from the transfer substrate by a picker and moving the plurality of micro LEDs to a predetermined position, and then transferring the plurality of micro LEDs to the target substrate. In this case, the picker may pick the micro LEDs through vacuum adsorption, electrostatic adsorption, and stamping.

In addition, the plurality of micro LEDs transported to the transfer substrate sequentially through the growth substrate and the transport substrate may be transferred to the target substrate through a laser lift off (LLO) method, which is a transfer method through a laser.

The disclosure provides a micro LED transfer method capable of improving display uniformity by minimizing a difference in luminance and chromaticity of the micro LEDs at a boundary between adjacent block unit regions transferred to a target substrate, when transferring the micro LEDs of a transfer substrate to the target substrate in block units, and a display module manufactured thereby.

Hereinafter, an apparatus for transferring micro LEDs according to an embodiment of the disclosure will be described. FIG. 1 is a block diagram schematically illustrating an apparatus for transferring micro LEDs according to an embodiment of the disclosure.

Referring to FIG. 1, an apparatus 1 for transferring micro LEDs may include a transfer part 10 for transferring a plurality of micro LEDs 61 and 63 (see FIG. 2) disposed in a predetermined arrangement on a transfer substrate 50 (see FIG. 2) to a target substrate 70 (see FIG. 4), and a stage 20 disposed adjacent to the transfer part 10 to move the target substrate in X, Y, and Z axis directions.

The transfer part 10 may be made of a structure for performing transfer in a pick and place method. For example, the transfer part 10 may include a picker (not illustrated) that picks the plurality of micro LEDs from the transfer substrate 50 to move the plurality of micro LEDs to the target substrate 70, and then places the plurality of micro LEDs at a predetermined position on the target substrate 70.

The transfer part 10 may be made of a structure for performing transfer in a laser lift off (LLO)method. Thereby, predetermined micro LEDs may be simultaneously transferred to the target substrate 70 from the transfer substrate 50 on which the plurality of micro LEDs are arranged. In this case, in order to perform a transfer process in the laser lift off (LLO) method, the transfer part 10 may include a laser oscillator (not illustrated) for irradiating a laser beam toward the transfer substrate 50, and a stage (not illustrated) for the transfer substrate that may move the transfer substrate 50 in an X-axis, a Y-axis, and a Z-axis and rotate the transfer substrate 50 around the Z-axis.

The stage 20 may detachably fix the target substrate 70 to the stage 20, and may move in the X-axis, the Y-axis, and the Z-axis while the target substrate 70 is fixed and rotate around the Z-axis.

The apparatus 1 for transferring micro LEDs may include a memory 30 in which characteristic information of the plurality of micro LEDs is stored, and a processor 40.

The memory 30 may be implemented as at least one of a flash memory, a ROM, a RAM, a hard disk, a multimedia card micro, or a card type memory (e.g., SD or XD memory).

The memory 30 may be electrically connected to the processor 40 to transmit signals and information to and from the processor 40. The memory 30 may store characteristic information of the plurality of micro LEDs which are input or irradiated, and the processor 40 may access the characteristic information stored in the memory 30.

The processor 40 controls an overall operation of the apparatus 1 for transferring micro LEDs. That is, the processor 40 may be electrically connected to the transfer part 10 and the stage 20 to control each component. That is, the processor 40 may determine positions on the target substrate 70 to which the plurality of micro LEDs are to be transferred, respectively, based on the stored characteristic information, and may control the transfer part 10 and the stage 20 to transfer the plurality of micro LEDs to the positions to be transferred.

In addition, the processor 40 may control the transfer part 10 and the stage 20 to transfer the plurality of micro LEDs grown on a growth substrate (not illustrated) to a transport substrate (not illustrated), and may also transport the plurality of micro LEDs transported to the transport substrate back to the transfer substrate 50.

The processor 40 may control the transfer part 10 and the stage 20 to transfer the plurality of micro LEDs arranged on the transfer substrate 50 to the target substrate 70. In the disclosure, all components are described as being controlled by a single processor 40, but are not limited thereto and each component of the apparatus 1 for transferring micro LEDs may be controlled by using a plurality of independent processors. Here, the processor 40 may include one or more of a central processing unit (CPU), a controller, an application processor (AP), a communication processor (CP), or an advanced RISC machine (ARM) processor.

Hereinafter, a transfer substrate according to an embodiment of the disclosure will be described with reference to FIG. 2.

A plurality of micro LEDs 61 and 63 may be disposed on the transfer substrate 50 according to an embodiment of the disclosure in a matrix arrangement.

In this case, on the plurality of micro LEDs, electrodes may be alternately disposed by one column in opposite directions. That is, on the transfer substrate 50, the micro LEDs 61 of odd-numbered columns may be formed in the order of an anode electrode 61a and a cathode electrode 61b along a column direction. On the transfer substrate 50, the micro LEDs 63 of even-numbered columns may be formed in the order of a cathode electrode 63b and an anode electrode 63a along the column direction.

In this case, when it is assumed that an electrode direction of the micro LEDs 61 of the odd-numbered columns is 0°, an electrode direction of the micro LEDs 63 of the even-numbered columns may be 180°.

In the disclosure, the odd-numbered columns and the even-numbered columns of the transfer substrate 50 are to describe that the electrode directions may be alternately disposed by one column in the opposite directions. Therefore, if the electrode direction of the micro LEDs 61 of the odd-numbered columns of the transfer substrate 50 is 180° (hereinafter, referred to as a second direction), the electrode direction of the micro LEDs 63 of the even-numbered columns of the transfer substrate 50 is 0° (hereinafter, referred to as a first direction).

In a process of growing the plurality of micro LEDs on the growth substrate, wavelength characteristics of each LED may be different for each region of the growth substrate. That is, if the micro LEDs disposed on one region of the growth substrate have a long wavelength, the micro LEDs disposed on a region farthest from one region may have a short wavelength. In addition, the micro LEDs disposed between one region and the region farthest from one region on the growth substrate may have a similar wavelength to the long wavelength as the micro LEDs are closer to one region, and conversely, the micro LEDs may have a wavelength similar to the short wavelength as the micro LEDs are closer to the region farthest from one region.

Figure 2:
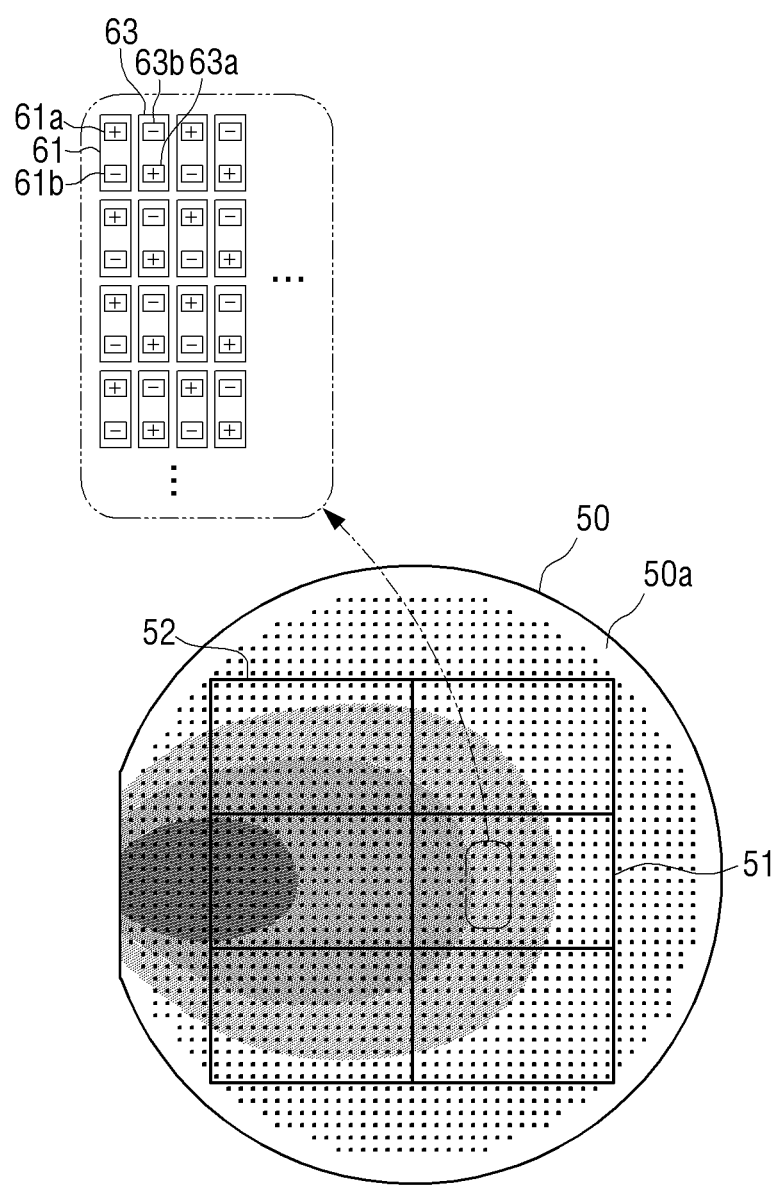
FIG. 2 is a diagram illustrating a transfer substrate according to an embodiment of the disclosure.

Therefore, when the plurality of micro LEDs are transported from the growth substrate to the transfer substrate 50, a characteristic dispersion of the plurality of micro LEDs transported to the transfer substrate 50 may appear as illustrated in FIG. 2. This may mean that the characteristic dispersion of the plurality of micro LEDs formed on the growth substrate also appears as illustrated in FIG. 2.

The transfer substrate according to an embodiment of the disclosure may be manufactured to be applicable to a pick and place method and an LLO method, respectively.

For example, the transfer substrate applied to the pick and place method may be manufactured in a state in which the anode electrodes 61a and 63a and the cathode electrodes 61b and 63b of each of the micro LEDs 61 and 63 are attached to an adhesive layer 50a of the transfer substrate 50. In this case, the anode electrodes 61a and 63a and the cathode electrodes 61b and 63b of each of the micro LEDs 61 and 63 may not be exposed to the outside and a light emitting surface of each of the micro LEDs may be exposed. In this case, the micro LED according to the disclosure may be a flip-chip type micro LED in which each electrode is positioned on the same surface of the micro LED and an opposite surface where each electrode is positioned is the light emitting surface. In addition, the micro LED according to the disclosure may also be a vertical type micro LED.

As such, the transfer substrate applied to the pick and place method may be manufactured in a state in which the electrodes of the plurality of micro LEDs on the growth substrate are disposed to correspond to the adhesive layer of the transfer substrate.

In addition, the transfer substrate applied to the LLO method may be manufactured in a state in which the anode electrodes 61a and 63a and the cathode electrodes 61b and 63b of each of the micro LEDs 61 and 63 are disposed toward an opposite side of the adhesive layer 50a of the transfer substrate 50. That is, the anode electrodes 61a and 63a and the cathode electrodes 61b and 63b of each of the micro LEDs 61 and 63 may be exposed to the outside and the light emitting surface of each of the micro LEDs may not be exposed while being attached to the adhesive layer 50a of the transfer substrate 50. In this case, the micro LED according to the disclosure may be a flip-chip type or vertical type micro LED.

As such, the transfer substrate applied to the LLO method may transport the plurality of micro LEDs to the transport substrate in a state in which the electrodes of the plurality of micro LEDs on the growth substrate are disposed to correspond to the adhesive layer of the transport substrate. Subsequently, the plurality of micro LEDs on the transport substrate may be transported in a state in which the light emitting surface is attached to the adhesive layer of the transfer substrate.

Hereinafter, diverse embodiments of transferring the plurality of micro LEDs in a block unit from the transfer substrate to the target substrate will be described. The transfer method according to diverse embodiments described below is not limited to any one of the pick and place method and the LLO method, and may be applied to both methods.

When the plurality of micro LEDs are transferred in the pick and place method, the plurality of micro LEDs may be transported from the transfer substrate to the target substrate in block units by a picker. When the plurality of micro LEDs are transferred in the LLO method, the plurality of micro LEDs may be transported from the transfer substrate to the target substrate in block units by a laser beam irradiated from a laser oscillator in a state in which the transfer substrate and the target substrate are stacked to be spaced apart from each other.

Referring to FIG. 2, the transfer substrate 50 may be partitioned into a plurality of blocks based on transferable quantity. The same number of micro LEDs may be disposed in each block, and a predetermined number of micro LEDs in each block may be sequentially transferred to the target substrate during one transfer. For instance, a set of micro LEDs among micro LEDs in one block may be sequentially transferred to the target substrate.

Figure 7:
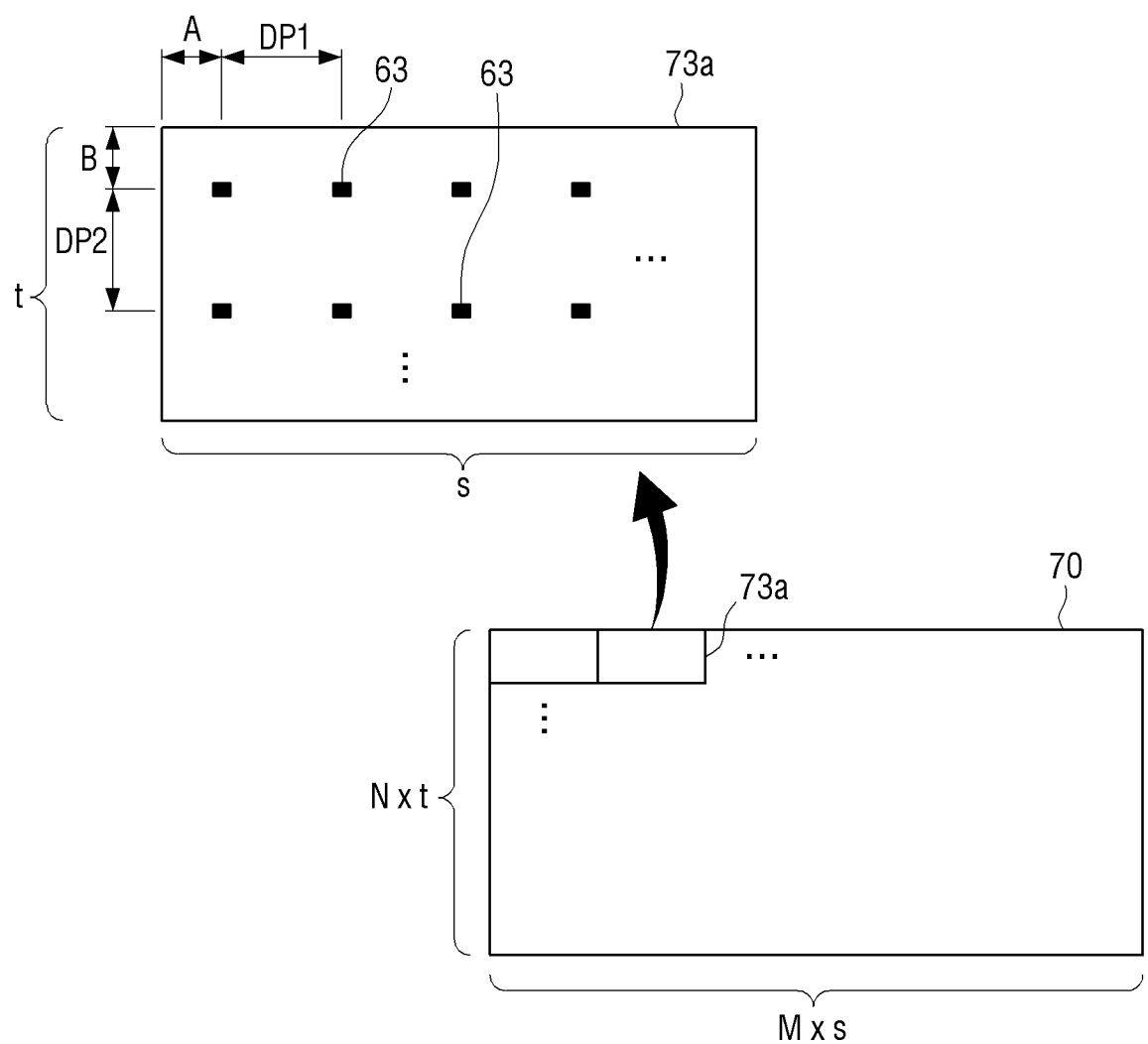
Figure 8:
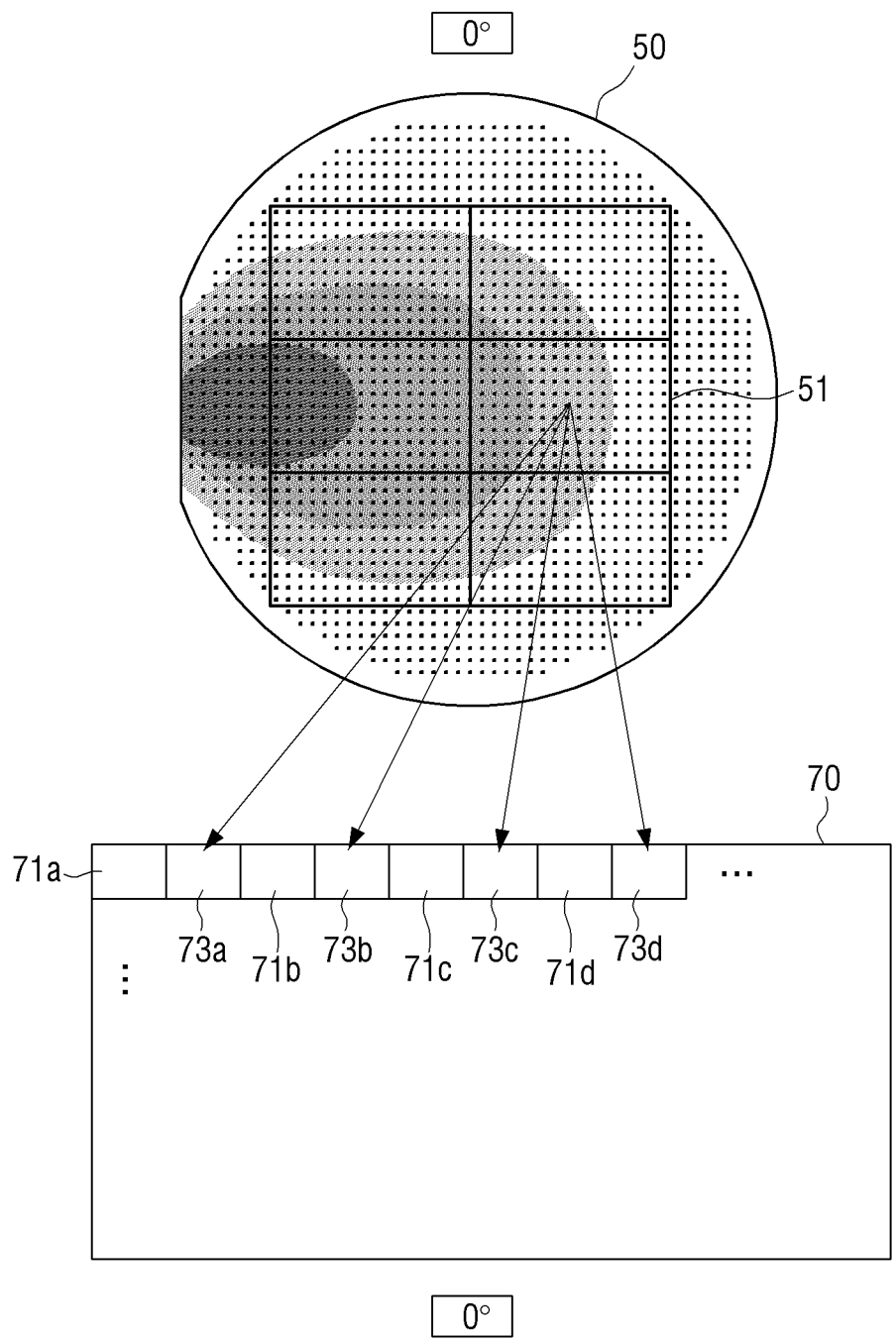
Figure 9:
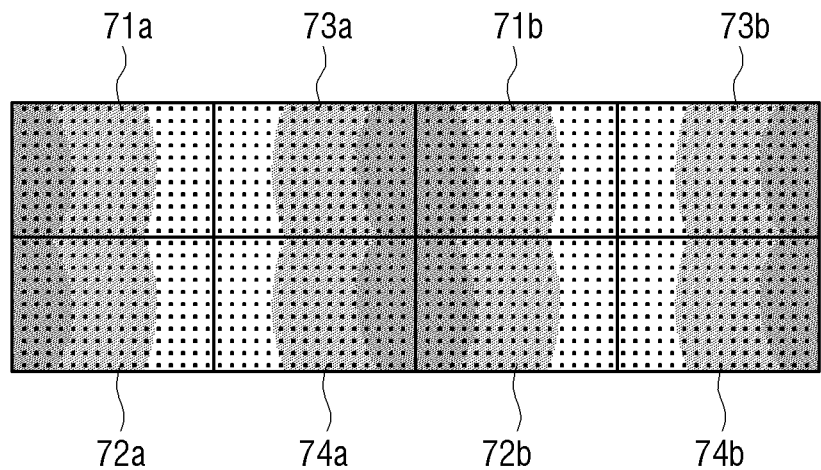
FIG. 9 is a diagram illustrating an example in which the micro LEDs are transferred in block units to a target substrate, and is a diagram illustrating an example in which a characteristic difference of the micro LEDs is minimized at a boundary of adjacent regions.

FIGS. 3 to 8 are diagrams sequentially illustrating a process of transferring micro LEDs according to an embodiment of the disclosure and FIG. 9 is a diagram illustrating an example in which the micro LEDs are transferred in block units to a target substrate, and is a diagram illustrating an example in which a characteristic difference of the micro LEDs is minimized at a boundary of adjacent regions.

Figure 3:
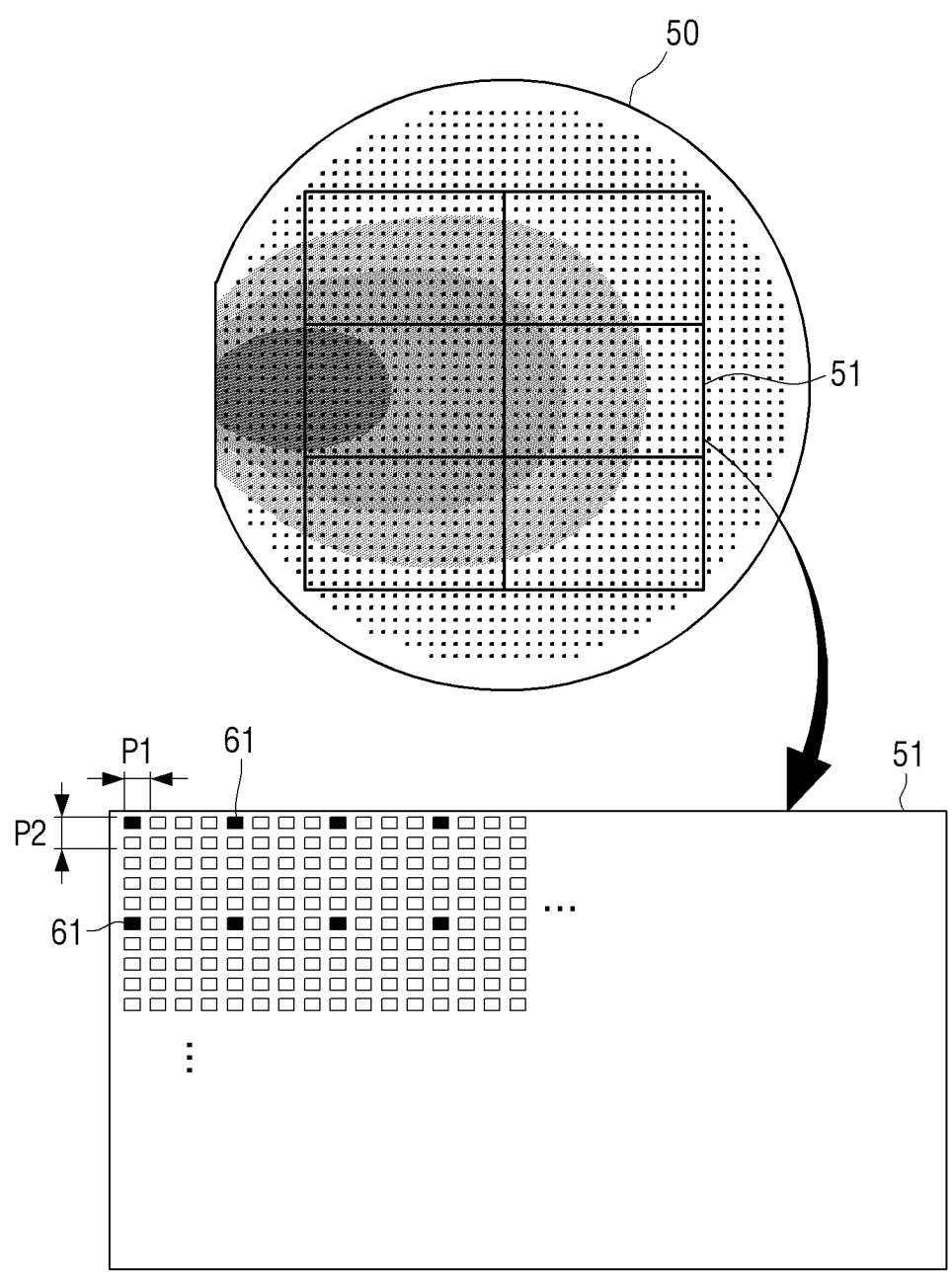
FIGS. 3 to 8 are diagrams sequentially illustrating a process of transferring micro LEDs according to an embodiment of the disclosure.

Referring to FIG. 3, the plurality of micro LEDs may be arranged on the transfer substrate 50 at a first pitch P1 in a row direction and at a second pitch P2 in a column direction. The first pitch P1 and the second pitch P2 may be set to be the same or different. The plurality of micro LEDs of the transfer substrate 50 may be disposed in a substantially matrix arrangement.

The micro LEDs in one block 51 among the plurality of blocks of the transfer substrate 50 are sequentially transferred to the target substrate 70 in block units in a predetermined number in a predetermined order. Here, the 'block unit transfer' does not mean simultaneously transferring all the micro LEDs disposed in one block 51 to the target substrate 70, but refers to transferring the same number of micro LEDs within one block 51 to the target substrate 70 multiple times. For instance, a set of micro LEDs among the micro LEDs in the one block 51 may be transferred to the target substrate 70 multiple times.

Figure 4:
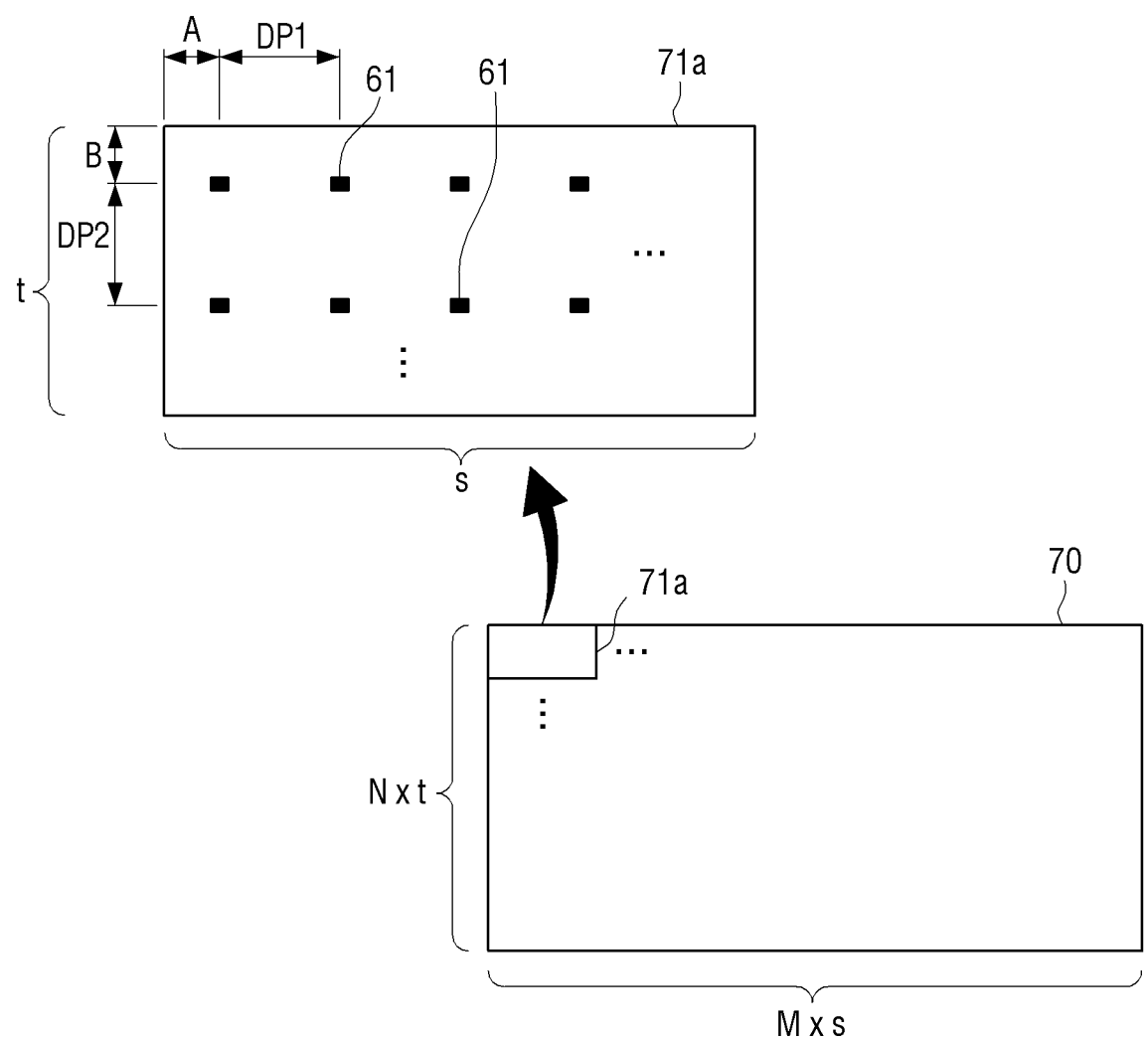

Referring to FIG. 3, the predetermined number of micro LEDs (disposed in odd-numbered columns of the transfer substrate 50 as the micro LEDs expressed in black) preset in one block 51 are transferred to a region 71a preset on the target substrate 70 as illustrated in FIG. 4. In this case, an interval in a column direction between the micro LEDs transferred to the predetermined region 71a is the same as a first display pitch DP1 of the target substrate 70, and an interval in a row direction thereof is the same as a second display pitch DP2.

In addition, an interval A between the micro LEDs arranged in the leftmost column of the target substrate 70 and a left edge of the target substrate 70 may be ½ of the first display pitch DP1, and an interval B between the micro LEDs arranged in the uppermost row of the target substrate 70 and an upper edge of the target substrate 70 may be ½ of the second display pitch DP2. In addition, although not illustrated in the drawing, an interval between the micro LEDs arranged in the rightmost column of the target substrate 70 and a right edge of the target substrate 70 may be ½ of the first display pitch DP1, and an interval between the micro LEDs arranged in the lowermost row of the target substrate 70 and a lower edge of the target substrate 70 may be ½ of the second display pitch DP2.

As such, by setting the interval between each edge of the target substrate 70 and the micro LEDs disposed closest to each edge as described above, the display modules adjacent to each other may be disposed such that the interval between the micro LEDs adjacent to a boundary of each display module is equal to the interval between the micro LEDs in a single display module. Therefore, it is possible to prevent the boundary between the display modules that are continuously connected from being visible.

Figure 5:
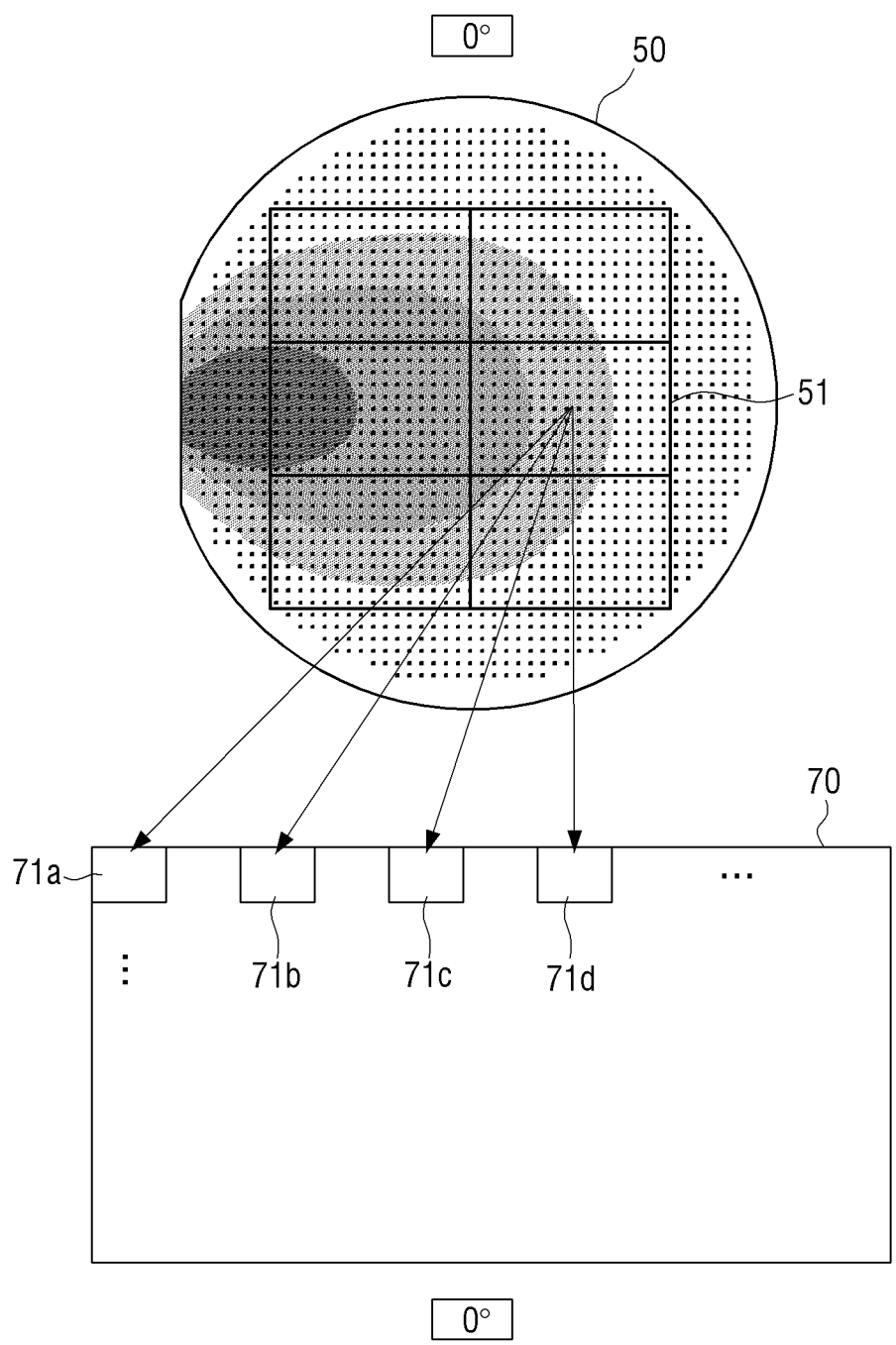

Referring to FIG. 5, the block unit transfer may be sequentially performed from one block 51 of the transfer substrate 50 to regions 71a, 71b. 71c, and 71d that are predetermined at equal intervals on the target substrate 70.

In this case, the micro LEDs transferred in block units to each of the regions 71a, 71b, 71c, and 71d of the target substrate 70 are transferred without rotation (0°). Accordingly, the micro LEDs of each of the regions 71a, 71b, 71c, and 71d maintain the directions of the anode electrodes and the cathode electrodes in the first direction (0°). In this case, the micro LEDs of each of the regions 71a, 71b, 71c, and 71d of the target substrate 70 are micro LEDs having the first direction which is the directions of the anode electrode and the cathode electrode in the transfer substrate 50 and disposed in the odd-numbered rows before being transferred.

Figure 6:
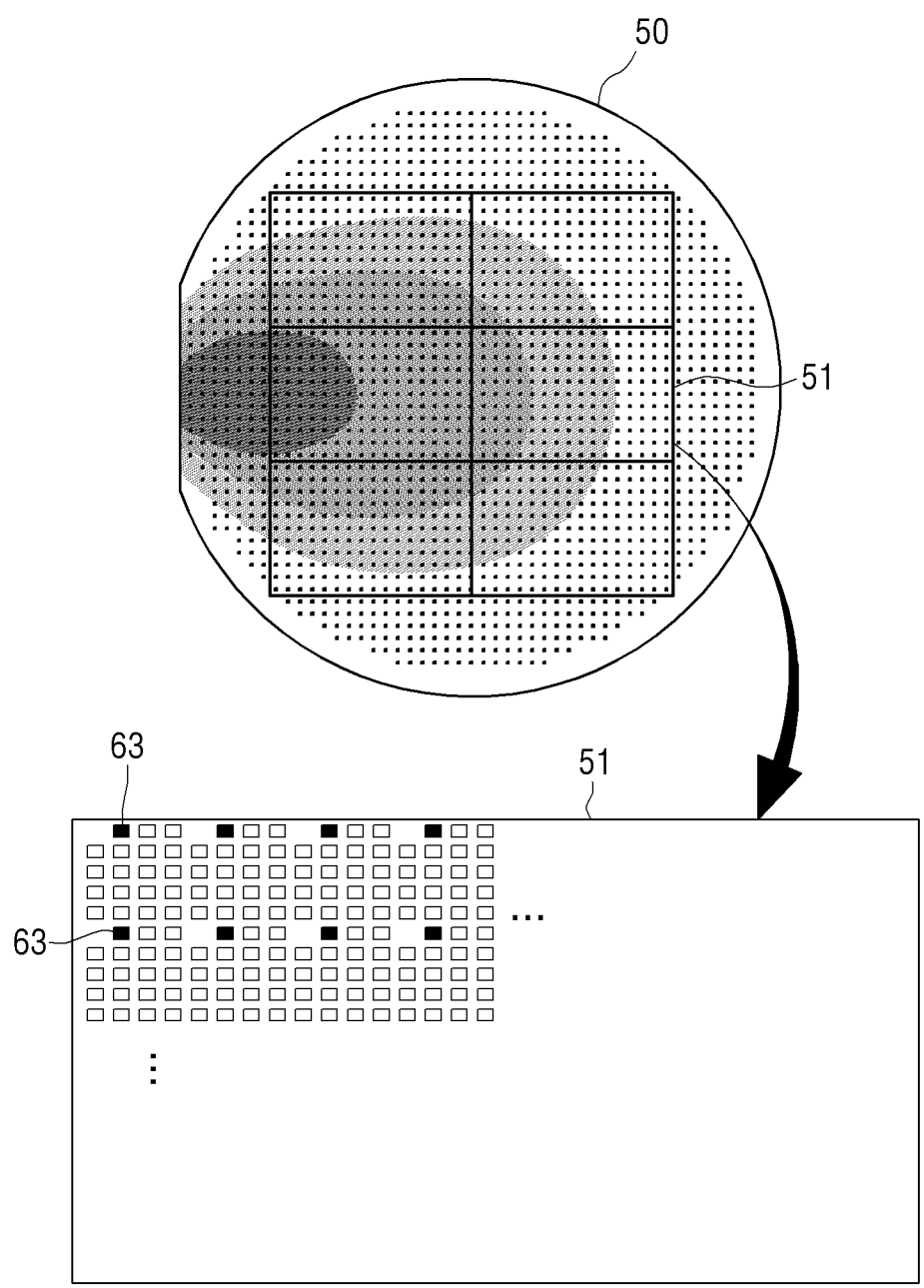

Referring to FIG. 6, the predetermined number of micro LEDs disposed in even-numbered columns of the transfer substrate 50 as the micro LEDs expressed in black in one block 51 are transferred to another region 73a preset on the target substrate 70 as illustrated in FIG. 7. In this case, intervals in the column direction and the row direction between the micro LEDs transferred to the predetermined other region 73a are equal to the first and second display pitches DP1 and DP2 of the target substrate 70, respectively.

Referring to FIG. 8, the plurality of micro LEDs in which the anode electrodes and the cathode electrodes are disposed in the second direction (180°) in one block 51 of the transfer substrate 50 may be sequentially transferred in block units to other regions 73a, 73b, 73c, and 73d that are predetermined at equal intervals on the target substrate 70. In this case, the plurality of micro LEDs are transferred to the target substrate 70 after being rotated by 180° when the block unit transfer to each of the regions 73a, 73b, 73c, and 73d is performed.

Therefore, all the micro LEDs transferred in block units to the target substrate 70 may all have the anode and cathode electrodes disposed in the same direction (e.g., the first direction).

On the target substrate 70, the micro LEDs of the odd-numbered columns and the micro LEDs of the even-numbered columns that were disposed on the transfer substrate 50 may be alternately disposed along the row direction of the target substrate 70.

Referring to FIG. 9, if the block unit transfer as described above is performed, the micro LEDs having the same or very similar characteristics such as luminance and chromaticity may be disposed at the boundary of each of the regions 71a, 71b, 72a, 72b, 73a, 73b, 74a, and 74b on the target substrate 70.

For example, referring to FIG. 9, the characteristics of the micro LEDs disposed at the boundary between one region 73a and the region 71a adjacent to the left side of the region 73a are the same or very similar. In addition, the characteristics of the micro LEDs disposed at each boundary with the regions 71b and 74a adjacent to the right and lower sides of one region 73a are also the same or very similar.

Therefore, in the method for transferring the micro LEDs according to an embodiment of the disclosure, it is possible to minimize a difference in luminance and chromaticity of the micro LEDs at the boundary of the adjacent regions transferred to the target substrate. Therefore, according to the disclosure, the boundary between the blocks in the display module, which has been visible in the display module manufactured through the conventional method for transferring the micro LEDs, may be improved to be invisible.

As illustrated in FIG. 9 described above, the micro LEDs transferred to the target substrate are transferred in block units so as to exhibit the same dispersion along each column direction of the target substrate.

Figure 10:
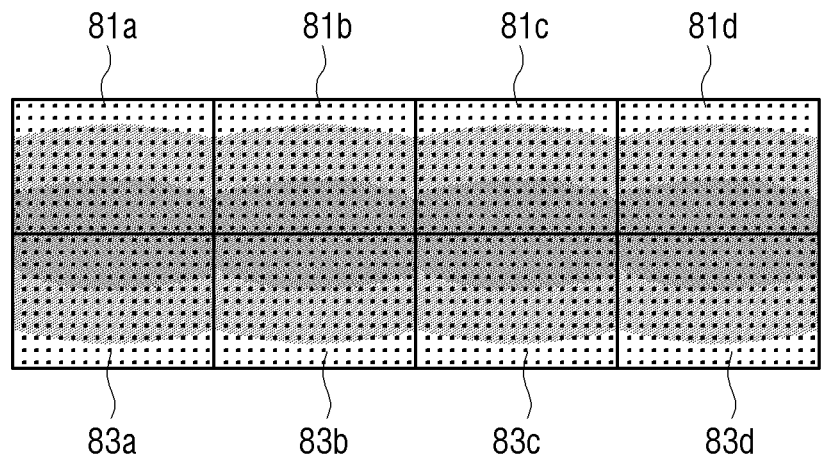
FIG. 10 is a diagram illustrating an example in which the micro LEDs are transferred in block units to a target substrate, and is a diagram illustrating another example in which a characteristic difference of the micro LEDs is minimized at a boundary of adjacent regions.

However, in order to minimize the difference in characteristics of the micro LEDs at the boundary of the adjacent regions, the block unit transfer may be performed in a pattern as illustrated in FIG. 10.

FIG. 10 is a diagram illustrating an example in which the micro LEDs are transferred in block units to a target substrate, and is a diagram illustrating another example in which a characteristic difference of the micro LEDs is minimized at a boundary of adjacent regions.

Referring to FIG. 10, the plurality of micro LEDs which are not spaced apart from each other and continuously transferred in block units to a first row of the target substrate may have the anode and cathode electrodes disposed in the first direction (0°). The plurality of micro LEDs which are not spaced apart from each other and continuously transferred in block units to a second row of the target substrate may have the anode and cathode electrodes disposed in the first direction (0°). In this case, the plurality of micro LEDs transferred in block units to the second row of the target substrate are disposed in the second direction (180°) on the transfer substrate, and therefore, when the plurality of micro LEDs are transferred to the target substrate, the plurality of micro LEDs are separated from the transfer substrate and then rotated by 180° to be transferred to the target substrate. Accordingly, the micro LEDs having the same or very similar characteristics such as luminance and chromaticity to each other may be disposed at a boundary of each of the regions 81a to 81d and 83a to 83d on the target substrate.

For example, referring to FIG. 10, the characteristics of the micro LEDs disposed at the boundary between one region 81b and the region 83b adjacent to the lower side of the region 81b are the same or very similar. In addition, the characteristics of the micro LEDs disposed at each boundary with the regions 81a and 81c adjacent to the left and right sides of one region 81b are also the same or very similar. Even in this case, it is possible to minimize the difference in luminance and chromaticity of the micro LEDs at the boundary of the regions adjacent to each other transferred to the target substrate. Therefore, according to the disclosure, the boundary between the blocks in the display module, which has been visible in the display module manufactured through the conventional method for transferring the micro LEDs, may be improved to be invisible. In the method for transferring the micro LEDs described above, the transfer substrate 50 and the target substrate 70 do not rotate in the transfer process, and are all disposed at the same angle (e.g., 0°). In this case, the micro LEDs of the even-numbered columns on the transfer substrate 50 are separated from the transfer substrate 50 by the picker and then rotated by 180°. The micro LEDs of the even-numbered columns rotated by 180° described above are transferred to the target substrate 70 by the picker.

However, in addition to the method described above, the transfer substrate or the target substrate may be disposed at different angles (e.g., 0° and 180°) in the transfer process. Hereinafter, each transfer method will be described with reference to FIGS. 11 to 14.

Figure 11:
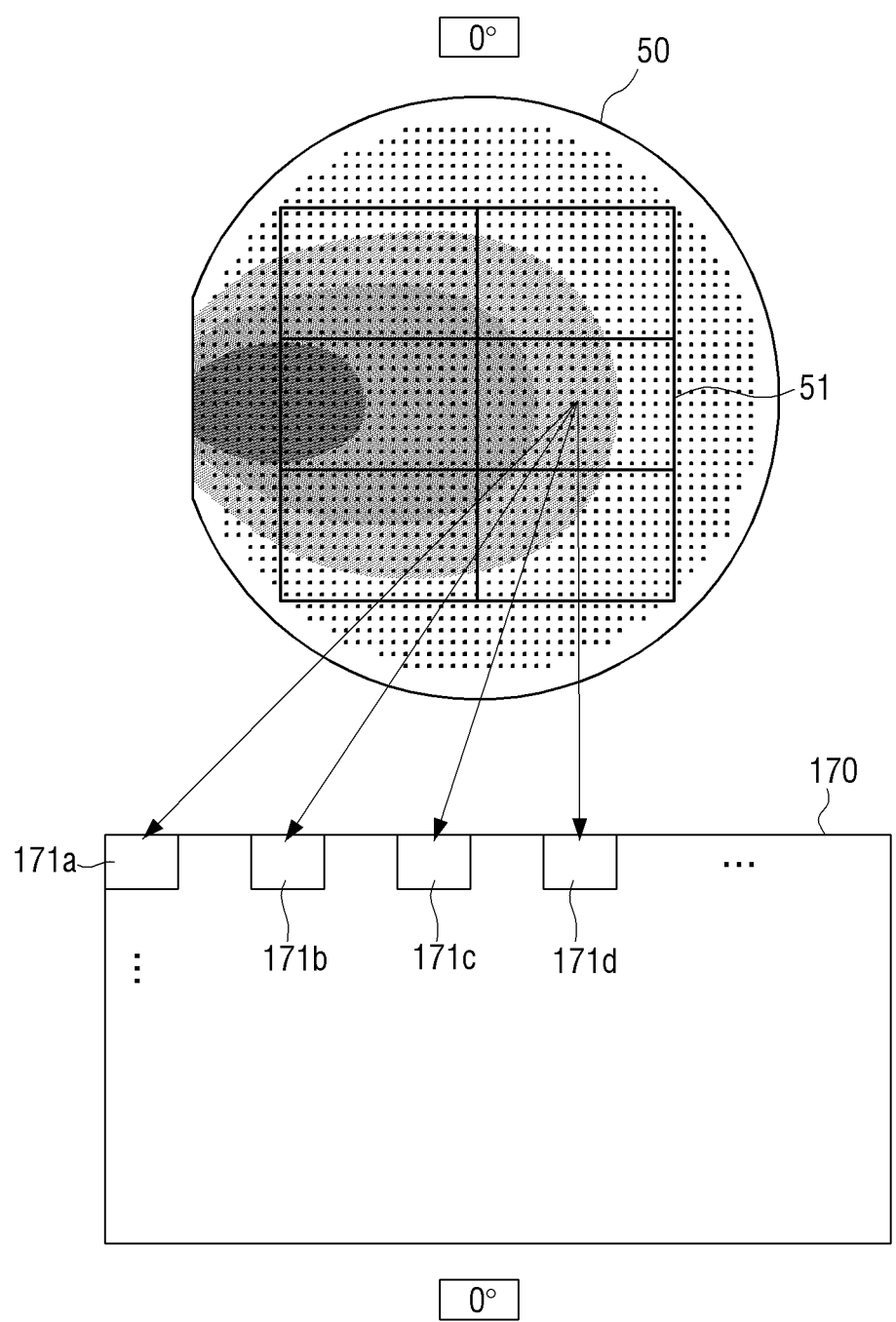
FIGS. 11 and 12 are diagrams sequentially illustrating a process of transferring micro LEDs by rotating the transfer substrate by 0° and 180°.
Figure 12:
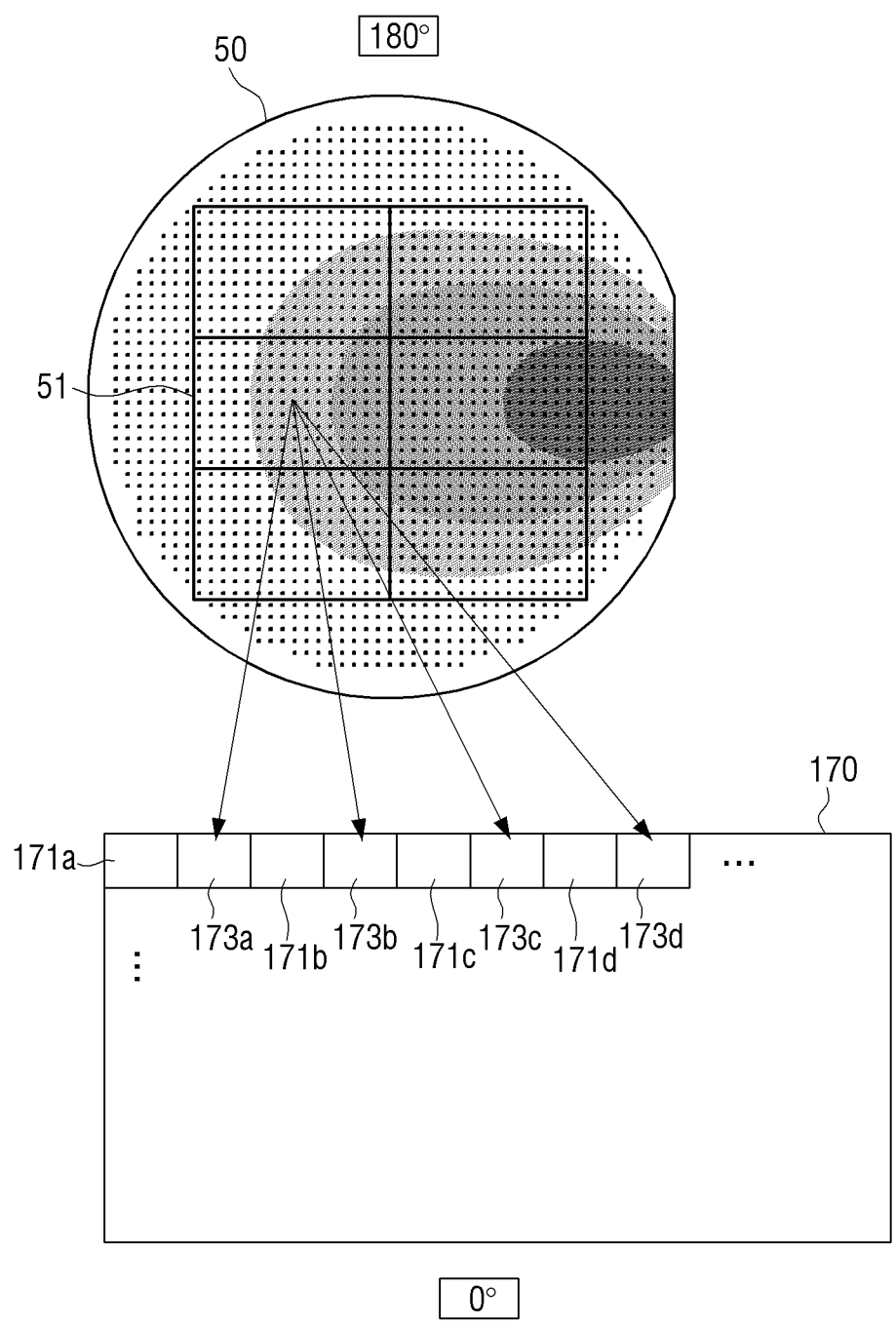

FIGS. 11 and 12 are diagrams sequentially illustrating a process of transferring micro LEDs by rotating the transfer substrate by 0° and 180°;

Referring to FIG. 11, the transfer substrate 50 and a target substrate 170 are disposed at the same angle (e.g., 0°).

In this state, the plurality of micro LEDs which are predetermined in one region 51 of the transfer substrate 50 are sequentially transferred in block units to each of predetermined regions 171a, 171b, 171c, and 171d of the target substrate 170.

In this case, the plurality of micro LEDs transferred to each of the regions 171a, 171b, 171c, and 171d of the target substrate 170 are transferred without rotation. Accordingly, the micro LEDs of each of the regions 171a, 171b, 171c, and 171d maintain the direction of the anode electrodes and the cathode electrodes in the first direction (0°).

Referring to FIG. 12, the transfer substrate 50 is rotated by 180°. In this case, the target substrate 170 is maintained at 0° without rotation.

In this state, the plurality of micro LEDs which are predetermined in one region 51 of the transfer substrate 50 are sequentially transferred in block units to each of predetermined other regions 173a, 173b, 173c, and 173d of the target substrate 170.

In this case, the plurality of micro LEDs transferred to other regions 173a, 173b, 173c, and 173d of the target substrate 170 are transferred in block units to the target substrate 170 in a state in which the transfer substrate 50 is rotated by 180°. Accordingly, the micro LEDs transferred to other regions 173a, 173b, 173c, and 173d have the direction of the anode electrodes and the cathode electrodes of the first direction (0°).

Therefore, all the micro LEDs transferred in block units to the target substrate 170 may all have the anode and cathode electrodes disposed in the same direction (e.g., the first direction).

Figure 13:
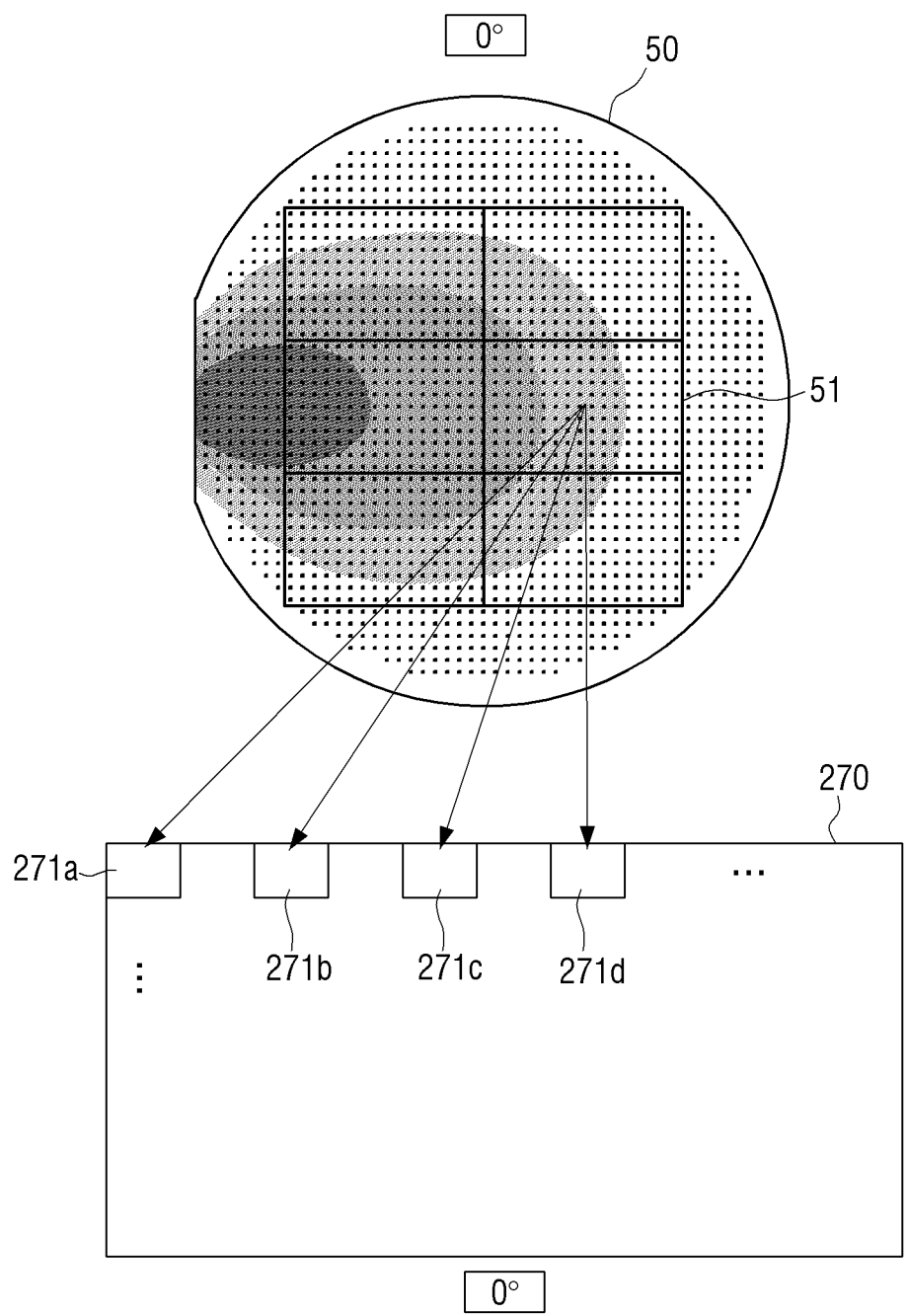
FIGS. 13 and 14 are diagrams sequentially illustrating a process of transferring micro LEDs by using a transfer substrate and rotating a target substrate by 0° and 180°.
Figure 14:
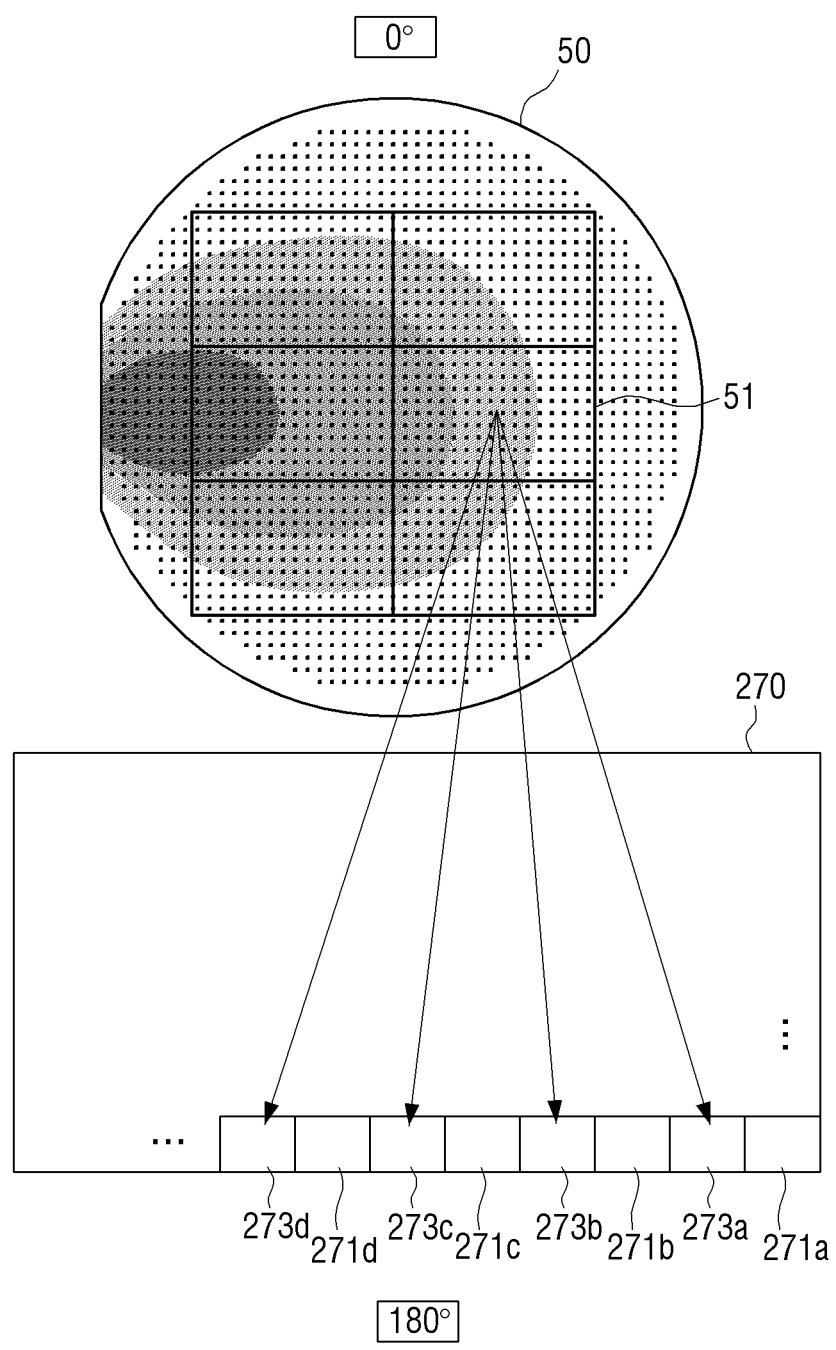

FIGS. 13 and 14 are diagrams sequentially illustrating a process of transferring micro LEDs by using a transfer substrate and rotating a target substrate by 0° and 180°.

Referring to FIG. 13, the transfer substrate 50 and a target substrate 270 are disposed at the same angle (e.g., 0°).

In this state, the plurality of micro LEDs which are predetermined in one region 51 of the transfer substrate 50 are sequentially transferred in block units to each of predetermined regions 271a, 271b, 271c, and 271d of the target substrate 270.

In this case, the plurality of micro LEDs transferred to each of the regions 271a, 271b, 271c, and 271d of the target substrate 270 are transferred without rotation. Accordingly, the micro LEDs of each of the regions 271a, 271b, 271c, and 271d maintain the direction of the anode electrodes and the cathode electrodes in the first direction (0°).

Referring to FIG. 14, the target substrate 270 is rotated by 180°. At this time, the transfer substrate 50 is maintained at 0° without rotation.

In this state, the plurality of micro LEDs which are predetermined in one region 51 of the transfer substrate 50 are sequentially transferred in block units to each of predetermined other regions 273a, 273b, 273c, and 273d of the target substrate 270.

In this case, the plurality of micro LEDs transferred to other regions 273a, 273b, 273c, and 273d of the target substrate 270 are sequentially transferred in block units from one region of the transfer substrate 50 which is maintained at 0° to the target substrate 270 which is rotated by 180°. Accordingly, the micro LEDs transferred to other regions 273a, 273b, 273c, and 273d have the direction of the anode electrodes and the cathode electrodes of the first direction (0°).

Therefore, all the micro LEDs transferred in block units to the target substrate 270 may all have the anode and cathode electrodes disposed in the same direction (e.g., the first direction).

The transfer methods described above use a single transfer substrate 50. On the single transfer substrate 50, the micro LEDs of the odd-numbered columns and the even-numbered columns having the directions of the anode and cathode electrodes of 0° and 180° are disposed in opposite directions.

The single transfer substrate used in the transfer methods described above is not limited to alternately disposing the electrode directions of the micro LEDs in the column direction, and may alternately dispose the electrode directions of the micro LEDs in the row direction.

The disclosure is not limited to using the single transfer substrate 50 described above, and may perform the block unit transfer using two transfer substrates. This will be described with reference to FIGS. 15 and 16.

Figure 15:
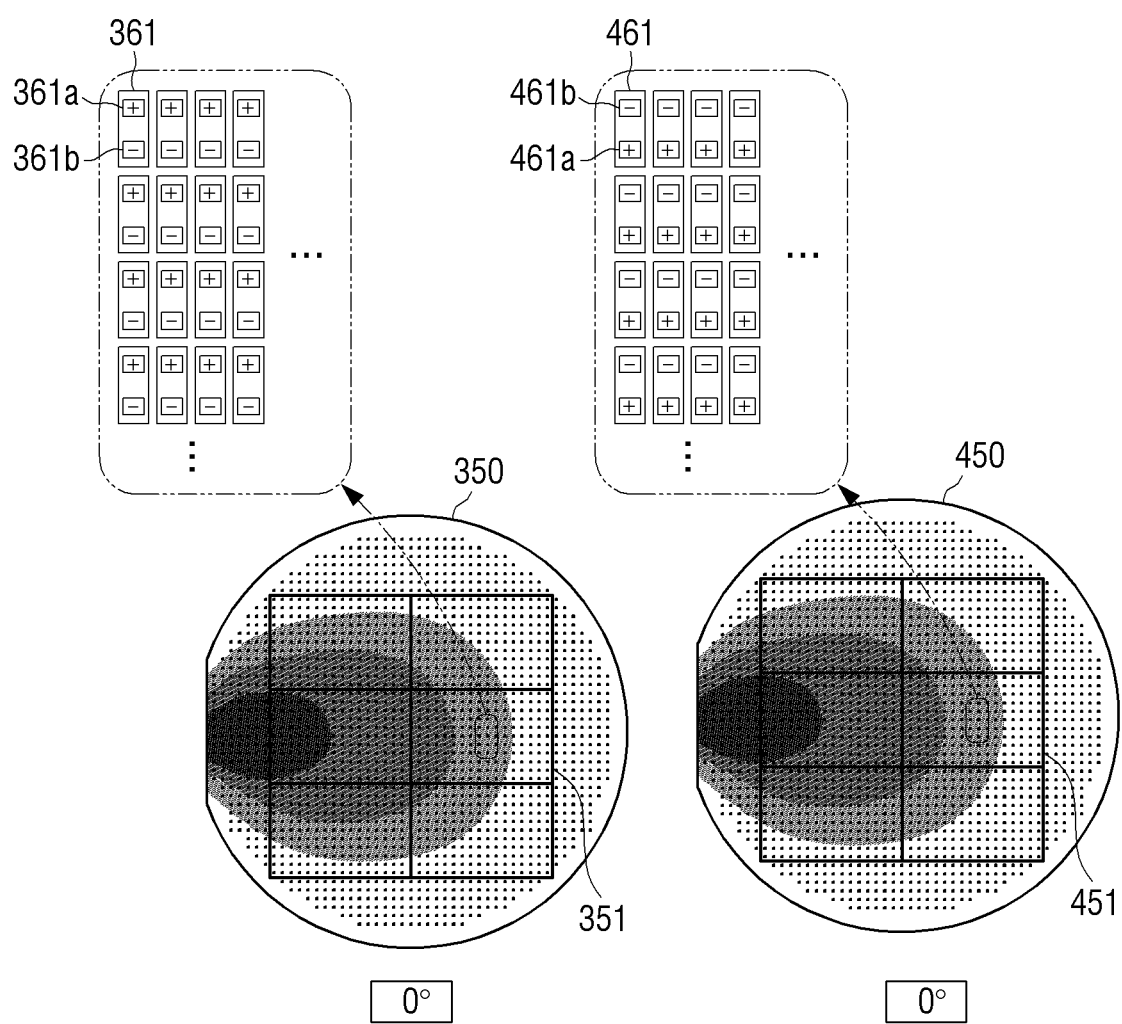
FIG. 15 is a diagram illustrating transfer substrates according to another embodiment of the disclosure.
Figure 16:
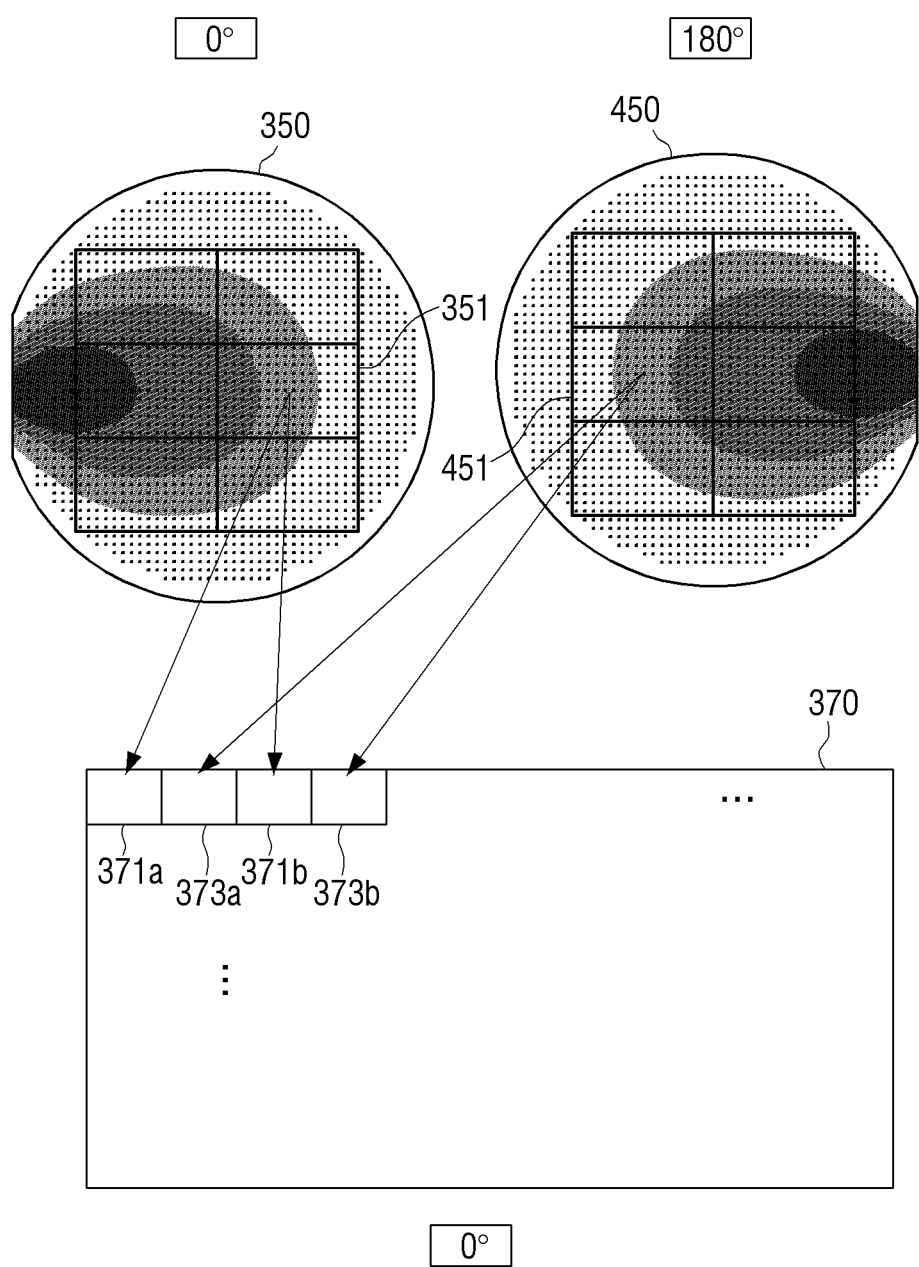
FIG. 16 is a diagram illustrating that the micro LEDs are transferred to the target substrate using the transfer substrates illustrated in FIG. 15.

FIG. 15 is a diagram illustrating transfer substrates according to another embodiment of the disclosure and FIG. 16 is a diagram illustrating that the micro LEDs are transferred to the target substrate using the transfer substrates illustrated in FIG. 15.

Referring to FIG. 15, transfer substrates according to another embodiment of the disclosure may include a first transfer substrate 350 and a second transfer substrate 450.

In the first and second transfer substrates 350 and 450, when the micro LEDs are epitaxially grown by the same manufacturing equipment, the characteristics distribution of the micro LEDs for the entire region may be almost the same as illustrated in FIG. 15.

In consideration of this, anode electrodes and cathode electrodes of the micro LEDs disposed on the first transfer substrate 350 and the second transfer substrate 450, respectively, may be disposed in different directions as illustrated in FIG. 15. That is, all the micro LEDs 361 of the first transfer substrate 350 may all have the anode electrodes 361a and the cathode electrodes 361b disposed in the same first direction (0°). All the micro LEDs 461 of the second transfer substrate 450 may all have the anode electrodes 461a and the cathode electrodes 461b disposed in the same second direction (180°).

Referring to FIG. 16, in a state in which the first transfer substrate 350 and the target substrate 370 are disposed at 0° and the second transfer substrate 450 is disposed at 180°, the plurality of micro LEDs of each of the transfer substrates 350 and 450 are transferred in block units to the target substrate 370.

In this case, the plurality of micro LEDs disposed on one region 351 of the first transfer substrate 350 are transferred in block units to predetermined regions 371a and 371b of the target substrate 370. At this time, the plurality of micro LEDs transferred to the regions 371a and 371b of the target substrate 370 are disposed in the first direction (0°).

One region 451 of the second transfer substrate 450 is a region corresponding to one region 351 of the first transfer substrate 350 in a state in which the second transfer substrate 450 is disposed at 0° as illustrated in FIG. 15. The plurality of micro LEDs disposed on one region 451 of the second transfer substrate 450 are transferred in block units to predetermined other regions 373a and 373b of the target substrate 370. At this time, the plurality of micro LEDs transferred to other regions 373a and 373b of the target substrate 370 are disposed in the first direction (0°).

Therefore, all the micro LEDs transferred in block units to the target substrate 370 may all have the anode and cathode electrodes disposed in the same direction (e.g., the first direction).

Figure 17:
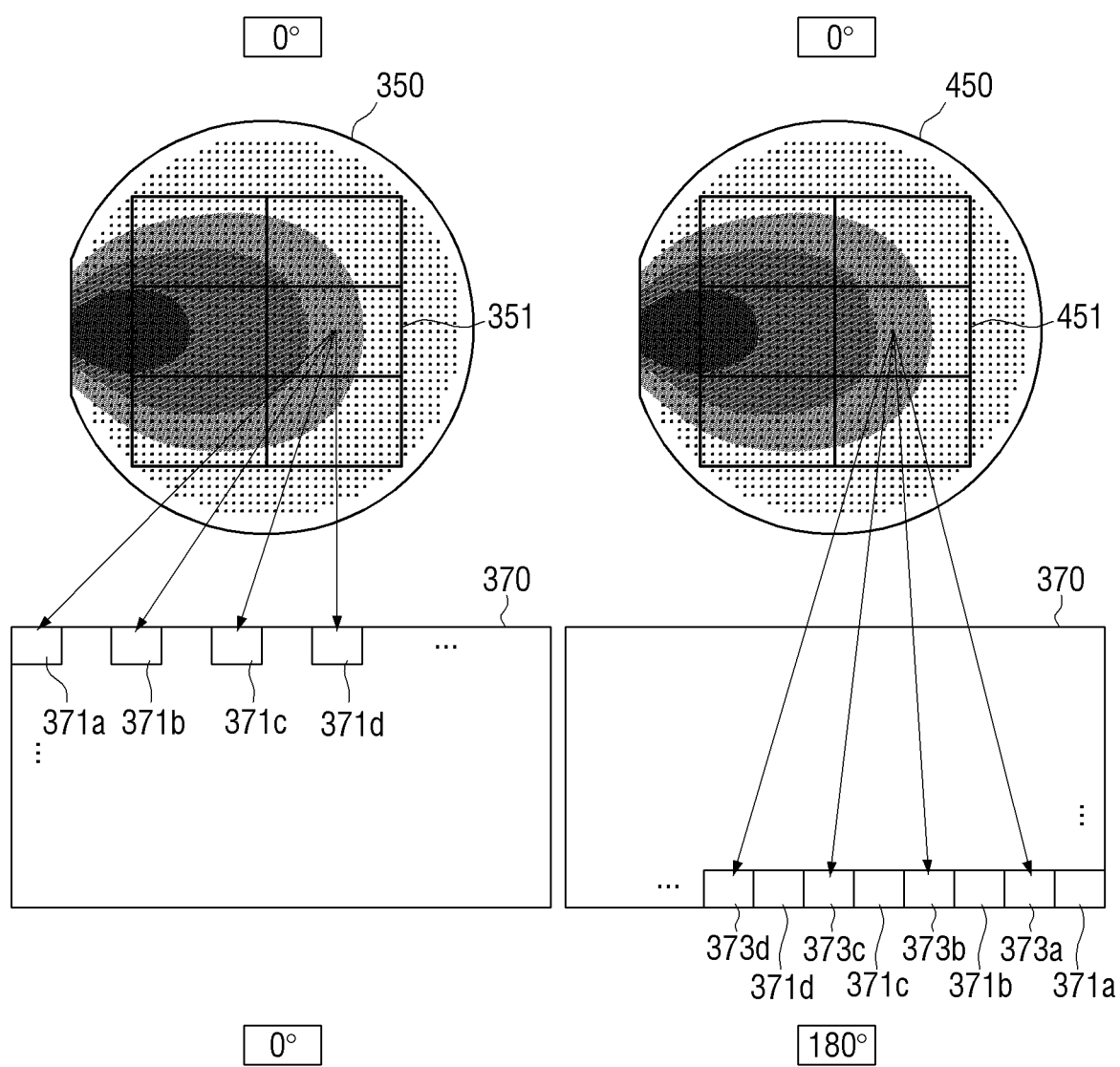
FIG. 17 is a diagram illustrating a process of transferring micro LEDs to the target substrate by using the transfer substrates illustrated in FIG. 15 and rotating the target substrate by 0° and 180°.

FIG. 17 is a diagram illustrating a process of transferring micro LEDs to the target substrate by using the transfer substrates illustrated in FIG. 15 and rotating the target substrate by 0° and 180°.

Referring to FIG. 17, the first and second transfer substrates 350 and 450 and the target substrate 370 are disposed at the same angle (e.g., 0°). In this case, the first transfer substrate 350 has the anode electrodes and the cathode electrodes of the plurality of micro LEDs which are disposed in the first direction (0°), and the second transfer substrate 450 has the anode electrodes and the cathode electrodes of the plurality of micro LEDs which are disposed in the second direction (180°).

In this state, the plurality of micro LEDs which are predetermined in one region 351 of the first transfer substrate 350 are sequentially transferred in block units to each of predetermined regions 371a, 371b, 371c, and 371d of the target substrate 370.

In this case, the plurality of micro LEDs transferred to each of the regions 371a, 371b, 371c, and 371d of the target substrate 370 are transferred without rotation. Accordingly, the plurality of micro LEDs of each of the regions 371a, 371b, 371c, and 371d maintain the direction of the anode electrodes and the cathode electrodes in the first direction (0°).

Subsequently, after rotating the target substrate 370 by 180°, the plurality of micro LEDs which are predetermined in one region 451 of the second transfer substrate 450 are sequentially transferred in block units to each of predetermined other regions 373a, 373b, 373c, and 373d of the target substrate 370.

In this case, the plurality of micro LEDs transferred to other regions 373a, 373b, 373c, and 373d of the target substrate 370 are sequentially transferred in block units from one region of the second transfer substrate 450 which is maintained at 0° to the target substrate 370 which is rotated by 180°. Accordingly, the micro LEDs transferred to other regions 373a, 373b, 373c, and 373d have the direction of the anode electrodes and the cathode electrodes of the first direction (0°).

Therefore, all the micro LEDs transferred in block units to the target substrate 370 may all have the anode and cathode electrodes disposed in the same direction (e.g., the first direction).

According to the disclosure as described above, when the plurality of micro LEDs are transferred to the target substrate by various methods described above, it is possible to improve visibility at the boundary between the blocks in the display module by minimizing the difference in luminance and chromaticity of the micro LEDs at the boundary of the regions adjacent to each other transferred to the target substrate.

A display module in which the plurality of micro LEDs are transferred by the transfer method described above will be described with reference to FIGS. 18 and 19.

Figure 18:
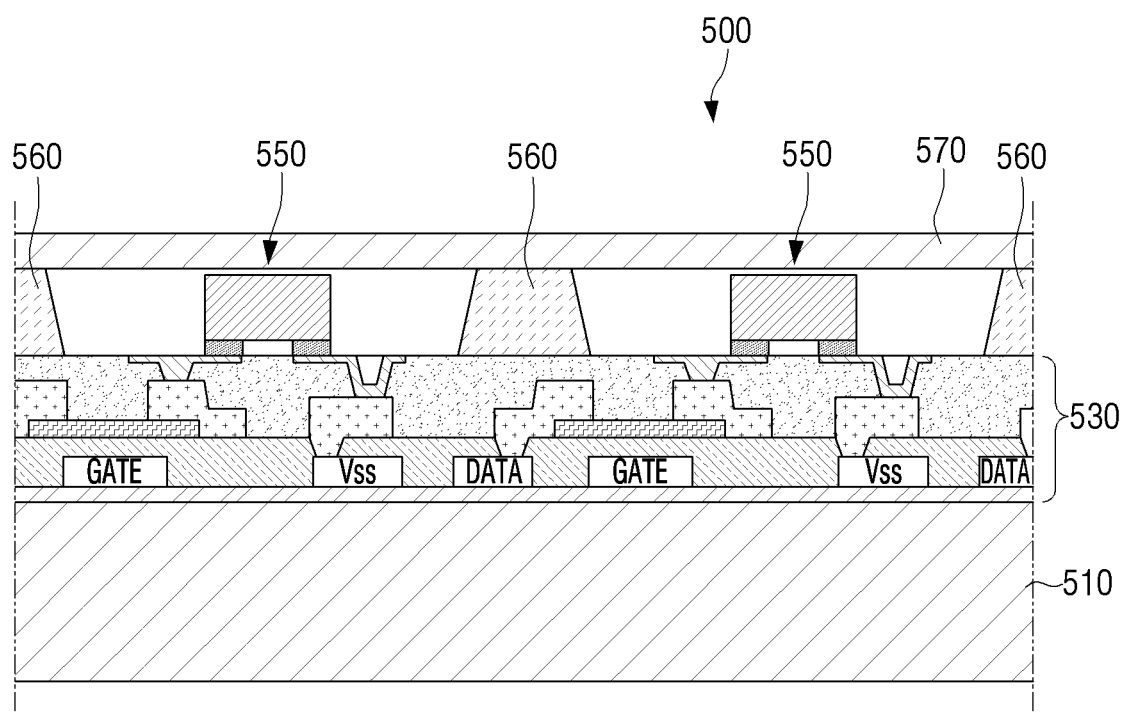
FIG. 18 is a partial cross-sectional view of a display module according to an embodiment of the disclosure.
Figure 19:
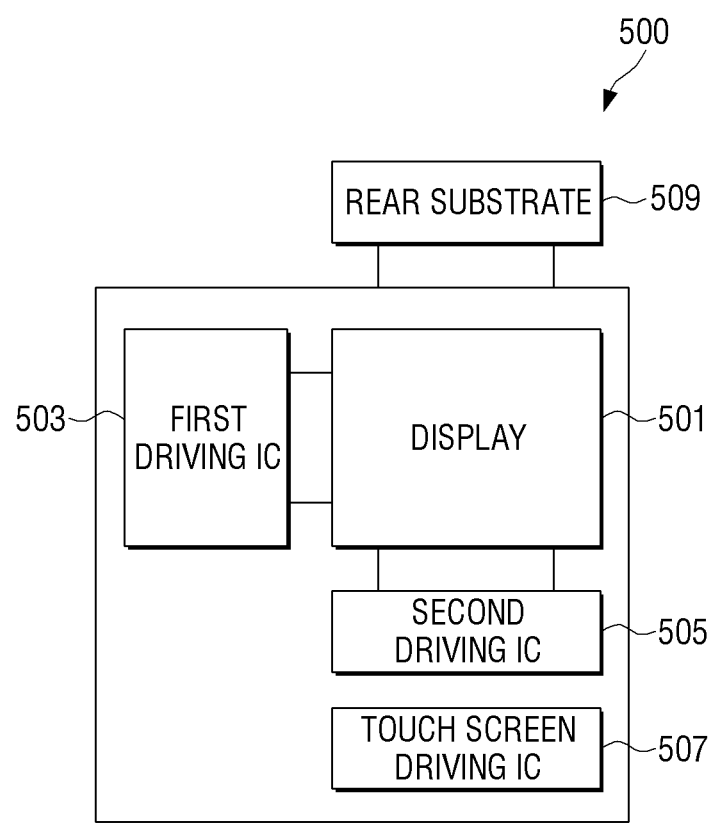
FIG. 19 is a schematic block diagram of the display module according to an embodiment of the disclosure.

FIG. 18 is a partial cross-sectional view of a display module according to an embodiment of the disclosure and FIG. 19 is a schematic block diagram of the display module according to an embodiment of the disclosure.

Referring to FIG. 18, a display module 500 according to the disclosure may include a transparent substrate 510, a thin film transistor (TFT) layer 530 formed on one surface of the transparent substrate 510, a plurality of micro LEDs 550 transferred to the TFT layer 530 and electrically connected to electrodes formed on the TFT layer 530, and a wiring (not illustrating) electrically connecting circuits (not illustrated) disposed on a rear surface of the transparent substrate 510. Here, the transparent substrate 510 may be formed of glass or quartz.

The display module 500 may include black matrices 560 partitioning the plurality of micro LEDs 550, respectively, and include a transparent cover 570 covering the plurality of micro LEDs 550 and the black matrices 560 together. In this case, a touch screen panel (not illustrated) may be stacked and disposed on one surface of the transparent cover 570.

Referring to FIG. 19, in the display module 500, a pixel driving method may be an active matrix (AM) driving method or a passive matrix (PM) driving method. The display module 500 may form a pattern of the wiring to which the micro LEDs are electrically connected according to each pixel driving method.

The display module 500 may include a display 501 and first and second driving integrated chips (ICs) 503 and 505 for driving the display. Although not illustrated in the drawing, the display module 500 may include a processor and a memory.

In addition, when a touch screen panel (not illustrated) is disposed on a side where the plurality of micro LEDs emit light, the display module 500 may include a touch screen driving IC 507 for driving the touch screen panel.

In addition, the display module 500 may include a communication device (not illustrated) capable of receiving data.

In addition, the display module 500 may include a rear substrate 509 that is electrically connected to the rear surface of the transparent substrate 510 through a flexible printed circuit (FPC).

The embodiments of the disclosure may be implemented in the form of a computer-readable recording medium that includes computer-executable instructions such as program modules executed by a computer. The computer-readable recording medium may be an arbitrarily available medium that may be accessed by the computer, including volatile, non-volatile, removable, and non-removable mediums. Such a computer-readable recording medium may be given in the form of a non-transitory storage medium. Here, the term 'non-transitory' just means that the storage medium is tangible excluding a signal (e.g. an electromagnetic wave), and does not distinguish between a case where data is semi-permanently stored in the storage medium and a case where data is transitorily stored in the storage medium.

Although the embodiments of the disclosure have been illustrated and described hereinabove, the disclosure is not limited to the abovementioned specific embodiments, but may be variously modified by those skilled in the art to which the disclosure pertains without departing from the gist of the disclosure as disclosed in the accompanying claims. These modifications should also be understood to fall within the scope and spirit of the disclosure,

What is claimed is:

1. A micro light emitting diode (LED) transfer method comprising:
   preparing a first transfer substrate including a plurality of first micro LEDs of which electrodes are disposed in a first direction, and a second transfer substrate including a plurality of second micro LEDs of which electrodes are disposed in a second direction different from the first direction;
   sequentially transferring the plurality of first micro LEDs in block units from the first transfer substrate to first regions of a target substrate; and
   sequentially transferring the plurality of second micro LEDs in block units from the second transfer substrate to second regions of the target substrate,
   wherein in the sequential transferring of the plurality of second micro LEDs, the plurality of second micro LEDs transferred to the second regions are disposed in the same electrode direction as an electrode direction of the plurality of first micro LEDs transferred to the first regions.

2. The micro LED transfer method as claimed in claim 1, wherein in the sequential transferring of the plurality of first micro LEDs, a first set of micro LEDs disposed on one region of a plurality of regions of the first transfer substrate are transferred in block units to the first regions of the target substrate, and
   wherein in the sequential transferring of the plurality of second micro LEDs, a second set of micro LEDs disposed on one region of the second transfer substrate corresponding to one region of the first transfer substrate are transferred in block units to the second regions of the target substrate.

3. The micro LED transfer method as claimed in claim 2, wherein in the sequential transferring of the plurality of second micro LEDs, the second set of micro LEDs have electrodes disposed in the second direction on the second transfer substrate and are transferred to the second regions after a posture of the second set of micro LEDs is changed so that the electrodes of the second set of micro LEDs are disposed in the first direction.

4. The micro LED transfer method as claimed in claim 3, wherein the posture of the second set of micro LEDs having the electrodes disposed in the second direction on the second transfer substrate is switched as the second set of micro LEDs are rotated by 180° by a picker.

5. The micro LED transfer method as claimed in claim 3, wherein the posture of the second set of micro LEDs having the electrodes disposed in the second direction on the second transfer substrate is switched as the second transfer substrate is rotated by 180°.

6. The micro LED transfer method as claimed in claim 3, wherein the second set of micro LEDs having the electrodes disposed in the second direction on the second transfer substrate are transferred to the second regions in a state in which the target substrate is rotated by 180°.

7. The micro LED transfer method as claimed in claim 1, wherein the first and second regions are alternately set along a row direction or a column direction of the target substrate.

8. A non-transitory computer readable recording medium including a program for executing the micro light emitting diode (LED) transfer method of claim 1.

* * * * *